(12) United States Patent
Erskine (10) Patent No.: US 6,564,162 B1
(45) Date of Patent: May 13, 2003

(54) METHOD AND APPARATUS FOR IMPROVING ELECTRICAL VERIFICATION THROUGHPUT VIA COMPARISON OF OPERATING-POINT DIFFERENTIATED TEST RESULTS

(75) Inventor: Keith Hall Erskine, Fort Collins, CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/541,423

(22) Filed: Apr. 3, 2000

(51) Int. Cl.[7] ............................................. G01R 31/00
(52) U.S. Cl. ........................ 702/120; 702/120; 702/123; 702/118; 714/25; 714/28; 703/15; 703/23; 703/27; 375/130; 375/140

(58) Field of Search ........................ 702/120; 714/27; 703/23, 28

(56) References Cited

U.S. PATENT DOCUMENTS 5,991,529 A * 11/1999 Cox et al. ................. 395/500.3
6,349,399 B1 * 2/2002 Mannning .................... 714/744

* cited by examiner

Primary Examiner—Marc S. Hoff
Assistant Examiner—Elias Desta (57) ABSTRACT

The operating-point differentiated test results are obtained by running a code sequence on the device at a first operating point to generate predicted results and then running the same code sequence on the device at a second operating point defined by changing an electrical parameter of the first operating point to generate actual results. Any differences that might exist between the predicted and actual results are due to the changed operating point of the device.

42 Claims, 3 Drawing Sheets

METHOD AND APPARATUS FOR IMPROVING ELECTRICAL VERIFICATION THROUGHPUT VIA COMPARISON OF OPERATING-POINT DIFFERENTIATED TEST RESULTS

CROSS REFERENCES TO RELATED APPLICATIONS

The subject matter of the present application is related to copending U.S. application, Ser. No. 09/541,253, titled "Method and Apparatus for Permuting Code Sequences and Initial Context of Code Sequences for Improved Electrical Verification", filed Apr. 3, 2000 assigned to the assignee hereof and herein incorporated by reference.

FIELD OF THE INVENTION

The present invention relates generally to the electrical verification of devices, such as microprocessors, digital signal processing (DSP) devices, and application specific integrated circuits (ASICs), that are capable of emulating their own results, and more particularly to a method and apparatus for improving electrical verification throughput of such devices by comparison of operating-point differentiated test results.

BACKGROUND OF THE INVENTION

Electrical verification of devices is performed to detect various electrical failures or weaknesses, as opposed to functional failures, of the devices. Electrical failures or weaknesses may be considered to be related to the electrical parameters, such as frequency, voltage, or temperature, that define the operating point under which a device must operate. The electrical robustness and reliability of the device may therefore be tested by subjecting the device to particular code sequences that are designed to test the electrical parameters of the device. Functional verification, as opposed to electrical verification, is concerned with uncovering functional failures that are indicative of design flaws of a device.

To date, electrical verification of devices that are capable of emulating their own results, such as microprocessors, digital signal processing (DSP) devices, and application specific integrated circuits (ASICs), has been heavily dependent upon software emulation of the device to generate predicted results against which actual results, generated by actually running an appropriate test case or code sequence on the device itself, can be compared. The comparison of actual and predicted test results provides an indication of how well the device is performing. A major drawback of this approach to electrical device verification is that it is inherently slow due to the vast majority of time that is spent in software emulation generating the predicted results. A related concern is the problem of tracking down emulation problems, commonly known as "emulation bugs," that are often associated with software emulation.

There is therefore an unmet need in the art to be able to enhance electrical verification of devices by lessening the dependence upon software emulation and testing using known good devices. Such an approach can be expected to lessen the time required for electrical verification, minimize the occurrence of emulation bugs, and otherwise render a more efficient electrical verification process.

SUMMARY OF THE INVENTION

Therefore, according to the present invention, a method, embodied within a computer program of a computer-readable medium or otherwise, for improving electrical verification of a device employs operating-point differentiated testing. The method minimally comprises generating a code sequence, generating predicted results running the code sequence, switching the device from a first to a second operating point by changing a parameter of the first operating point to define the second operating point, running the code sequence at the second operating point to generate actual results, and comparing the actual results to the predicted results to determine if they match. Some indication of the results, such as an error message that is displayed or printed, may follow. If the actual results do not match the predicted results, software emulation of the code sequence may be performed to verify the predicted results. Predicted results may be generated by software emulation of the code sequence or by running the code sequence on the device at the first operating point.

The methodology of the present invention is made more robust by permuting the code sequence, either by permuting an initial context in which the code sequence operates or by permuting the code sequence itself, and by generating multiple code sequences. The methodology can thus additionally include comparing a permute index to the number and, if the permute index is less than the number of permutes to be performed, permuting the code sequence to generate a permuted code sequence. The methodology is then performed on the permuted code sequence and the permute index is incremented. Additional code sequences are generated by comparing a sequence index to a number of sequences to be generated and, if the sequence index is less than the number of sequences, generating a new code sequence on which the methodology is performed.

BRIEF DESCRIPTION OF THE DRAWINGS

The novel features believed characteristic of the invention are set forth in the claims. The invention itself, however, as well as the preferred mode of use, and further objects and advantages thereof, will best be understood by reference to the following detailed description of an illustrative embodiment when read in conjunction with the accompanying drawing(s), wherein:

DESCRIPTION OF THE INVENTION

Electrical verification is performed to detect various electrical failures or weaknesses, as opposed to functional failures, of the device being tested. Electrical failures or weaknesses are often related to electrical parameters, such as frequency, voltage, or temperature, that define the operating point of the device under test. The electrical robustness and reliability of a device may therefore be tested by subjecting the device to various randomly generated code sequences at various operating points to test electrical sensitivities or failures of the device at multiple operating points. The present invention greatly lessens the dependence of electrical verification upon software emulation by employing a methodology that relies upon operating-point differentiated test results. Software emulation and its attendant problems are eliminated by comparing operating-point differentiated results of code sequence execution.

Therefore, according to a preferred embodiment of the present invention, a code sequence is run on a device, such as a microprocessor, operating at a first operating point defined by one or more electrical parameters, such as voltage or a frequency, to obtain predicted results for the particular code sequence. The code sequence is then run again on the microprocessor device at a second operating point, defined by changing an electrical parameter of the first operating point, such as a frequency or voltage, to generate the actual results. The deterministic nature of processor execution of the code sequence dictates that the actual results should be the same as the predicted results. Thus, any discrepancies or differences between the predicted results and the actual results are attributable to differences between the first and second operating points characteristic of the two separate test runs. Thus, if a particular code sequence is run on the device at a first frequency of 400 MHz to generate predicted results and then run at a second frequency of 600 MHz to generate actual results, the differences between the predicted and actual test results can be attributed to the difference in operating frequency between the tests.

Figure 1:
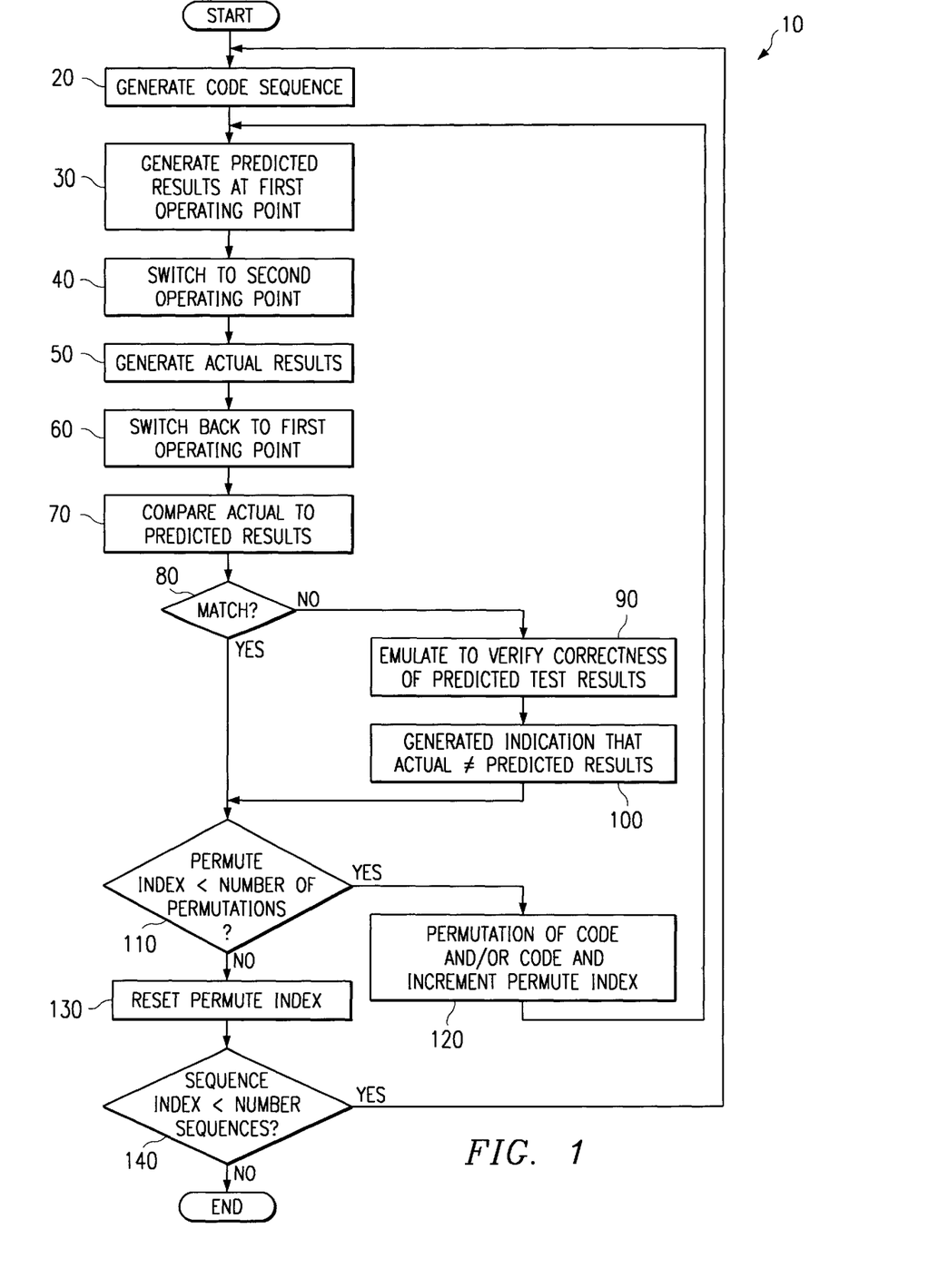
FIG. 1 is a flowchart that illustrates the methodology of the present invention for electrical verification of a device using operating-point differentiated results, in accordance with the present invention.

Referring now to FIG. 1, flowchart 10 illustrates the overall methodology of the present invention for electrical verification of a device using operating-point differentiated results. It is expected and understood that the methodology described in the figures herein may be implemented by instructions of a computer program of a computer-readable medium, such as microprocessors, digital signal processing (DSP) devices, and application specific integrated circuits (ASICs). At Block 20, the initial code sequence to be run by the device during electrical verification is generated. Creating the code sequence may be based on a probability file in which probabilities are assigned to known types of instructions and to expected types of code. Software algorithms and, optionally, software emulation are used to initially construct a code sequence having specific probabilities of various instruction types, various data types, etc. The code sequence may be any desired length, such as 20–100 lines of code, for instance. The code sequence will further have an initial context when created that is reflective of values contained within general registers, floating point registers, and cache memory of the device, assuming that the device is a microprocessor, for instance.

Figure 2:
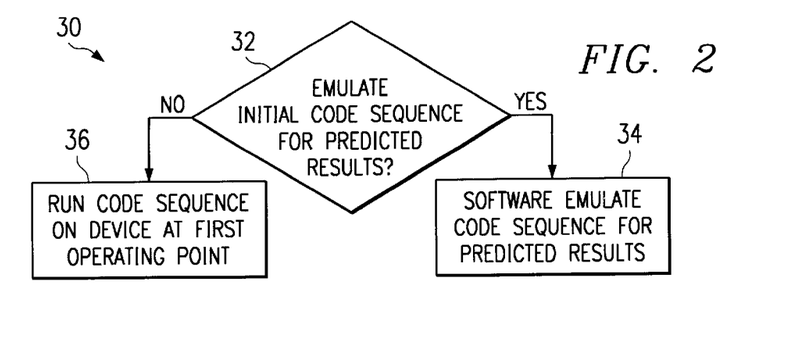
FIG. 2 illustrates the methodology for generating predicted results for the initial code sequence at a first operating point of the device, in accordance with the present invention.

The next step, shown at Block 30, is to generate the predicted results of the device running the code sequence generated at Block 20. As shown in FIG. 2, predicted results for the initial code sequence, i.e. before permutations or changes have occurred to the code sequence, are generated by either running the initial code sequence on the device at a first operating point of the device or by performing software emulation on the initial code sequence. Thus, at Decision Block 32, the inquiry is whether software emulation of the initial code sequence is to be used to generate the predicted results. If software emulation is to be used, then software emulation of the initial code sequence at Block 34 generates the predicted results. If software emulation is not to be used, then the initial code sequence is actually run on the device at a first operating point, defined by one or more electrical parameters such as frequency, voltage, and temperature, to generate the predicted results as shown at Block 36.

If software emulation is not used to generate predicted results of the device running the code sequence, as in Block 36, then the methodology of the present invention employs no required software emulation (other than possibly to generate the initial sequence). The lack of software emulation to generate the predicted results is a greatly significant improvement over the prior art method of electrical verification of devices; a vast amount of time is saved by not having to perform emulation during electrical verification. It is hereby noted that even if predicted results are obtained by software emulation of the initial code sequence, such as at Block 34, the amount of software emulation used by the methodology of the present invention as a whole is significantly reduced from those methodologies of the prior art that make extensive use of software emulation for electrical verification of devices.

Once the predicted results are obtained, then the device switches to a second operating point of the device by changing an electrical parameter of the first operating point at Block 40; it is noted that even if software emulation at Block 34 were employed to generate the predicted results, the device nonetheless has a first operating point associated with it. The second, changed electrical parameter of the second operating point of the device, whether voltage or frequency, may be any appropriate value so long as it is different from a first electrical parameter of the first operating point of the device. Thus, assuming that the first and second electrical parameters of the first and second operating points under which a code sequence is run on the device, respectively, are frequencies, the first electrical parameter may be a frequency that is lower than the second electrical parameter or frequency, or vice versa. The second electrical parameter may be a higher frequency in order to test one or more speed paths of the device under test, or it may be a lower frequency to test frequency floors associated with the device. Moreover, suppose that the first operating point were defined by frequency F1 and voltage V1 (F1, V1). The second operating point may be defined by changing either of these two electrical parameters, F1 or V1, of the first operating point. Thus, the second operating point of the device could be obtained by changing the frequency of the first operating point (resulting in a second operating point of F2, V1) or by changing the voltage of the first operating point (resulting in a second operating point of F1, V2). As an example, if the second operating point were to be defined by changing the voltage parameter of the first operating point from V1 to V2, generating the actual test results at Block 40 may help identify electrical problems of the device that are not necessarily dependent upon the frequency of the device. For instance, changing the voltage provided to the device may assist in identifying electrical failures/concerns caused by phenomenon such as charge sharing, leakage currents, ground noise, etc.

Next, at Block 50, the device runs the code sequence at the second operating point to generate actual results. At Block 60, the device switches back to the first operating point. The first operating point is generally closer to the operating point at which the device was designed to operate while the second operating point is generally further away from this designed operating point and thus may be considered a more "at risk" operating point for the device. Switching the device back to the first operating point before proceeding with the comparison of actual to predicted test results provides a more stable electrical environment in which the comparison can take place. At Block 70, the actual results generated at Block 50 are compared to the predicted results from Block 30 to determine whether there is a match.

Due to the deterministic nature of processor execution of software or firmware code, there is an expectation that a device, such as a microprocessor, will yield the same results when running the same code sequence. Thus, any discrepancy or difference between the predicted and actual results must be caused by operation of the device at the different operating points. Decision Block 80 determines what action will be taken as a consequence of whether the actual results match the predicted (expected) results. If there is not a match between the actual and predicted test results, then at Block 90 software emulation of the code sequence, whether the original code sequence or a permuted code sequence, is performed, if it has not been previously performed, at the first operating point to identify which of the predicted results or the actual results are correct. A blind comparison of the predicted and actual results does not indicate which type of test result is incorrect; thus software emulation is performed to make sure that the predicted results are correct. An indication that the actual results do not match the predicted results is next generated at Block 100. The indication, for example, may be an error message that is either printed or otherwise displayed to a user of the present invention. It is noted that the steps displayed in Blocks 90 and 100, while useful, are optional steps that are not necessary to the practice of the invention. For instance, if there is no match, then an indication of the mismatch could be generated at Block 100 without first performing software emulation at Block 90. Moreover, the software emulation of the original or permuted code sequence at the first operating point that is performed at Block 90 to identify specific errors need not be presented to the user in the form of an indicator, such as an error message, as shown at Block 100.

Running a code sequence on a device at a first operating-point and then running the same code sequence at a second operating-point provides the flexibility to overcome so-called "masking failures" that can otherwise mask other types of electrical failures. Consider, for instance, that a microprocessor has floating point speed paths that will only begin to fail at about 400 MHz (F2) operation but also has an integer speed path that fails at a lower frequency of about 380 MHz (F1). According to the prior art approach to electrical verification, the integer speed path failures at 380 MHz could be predicted to mask the floating point speed path failures at the higher frequency by either corrupting predicted (expected) results or by causing the system to crash. Using the first and second operating-point differentiated comparison testing of the present invention, however, the integer speed paths are less likely to cause a failure because only a very few instructions of the code sequence are run at the higher frequency. If the "masking" failure occurs at both frequency F1 and frequency F2, but does not crash the microprocessor system, the "masking" behavior will be entirely transparent.

After comparing the actual results to the predicted results of the initial code sequence to determine if there is a match, the methodology next determines what, if any, additional electrical verification of the device is to take place. If additional electrical verification of the device is to be performed using the same code sequence, then the code sequence is permuted or changed prior to again generating predicted and actual results for the new, permuted code sequence. If additional permutations of the initial code sequence are not desired, then a different code sequence is generated to test the device. These aspects of the methodology are shown in Blocks 110 to 140 of flowchart 10.

The next inquiry, then, is whether one or more permutations of the code sequence generated at Block 20 are to be generated for subsequent testing of the device. It is noted here that permutation of the code sequence is meant, at a minimum, to include both permutation of the initial context (such as the values contained within general registers, floating point registers, cache memory, etc.), referred to as context permutation, in which the code sequence is run and permutation of the code sequence itself, referred to as code permutation. Multiple verification cases are generated from a single code sequence by permuting, or changing, the code sequence; as explained above, permuting the code sequence may be done by either permuting the initial context of the code sequence or permuting the code sequence itself. The initial context of the code sequence refers to the environment in which the code sequence is to be run and is defined by a variety of factors, including, but not limited to, values contained in general registers, floating point registers, and cache memory, for instance, upon which the code sequence operates.

Permuting the code sequence to yield a permuted code sequence and/or code context can be further used to test the electrical properties of the device and thereby provides an important advantage. Permuting the initial context upon which the code sequence operates allows electrical failures associated with the initial context data values of the device, such as the contents of registers and cache tables of the devices, to be quickly discovered. Permuting the code sequence itself provides the additional advantage of exercising the device more robustly by allowing the introduction of new register data dependencies, result bypassing, pipeline stalling, etc., into the testing process.

The following example illustrates the concepts of code permutation and context permutation. Assume that instruction #1 of a code sequence is "ADD REG5, REG7, REG9", meaning that the contents of registers 5 and 7 are added and the results placed in register 9. The code sequence itself might be permuted, in a process called code permutation, to change instruction #1 to: "MPY (multiply) REG5, REG7, REG9". Or, in another example of code permutation, instruction #1 might be permuted to: "ADD REG6, REG7, REG9"; in this instance, the opcode or instruction field that specifies the first operation for the ADD operation has been changed from register 5 to register 6, a different operand. This type of code permutation is distinct from permuting the original context in which a particular code sequence is run, referred to as context permutation. Again assuming that instruction #1 is "ADD REG5, REG7, REG9", the initial context may be permuted by changing the initial context of register 5 and re-running the original instruction "ADD REG5, REG7, REG9". Thus, if the original context had a value of decimal 00017 in register 5 (REG 5), then changing the value in register 5 to decimal 000008 will permute the initial context and leave instruction #1 unchanged.

Whether permutation of the code sequence is to be performed is dependent upon whether a specified, predetermined number of permutations of the code have occurred. At Decision Block 110, a permute index is compared to the predetermined number of permutes to determine whether any permutations of the code sequence is to be performed. If the permute index is less that the number of permutes, then a permutation of the code sequence, whether permutation of the code sequence itself or of the context of the code sequence, is indicated. The code sequence and/or code context is permuted and the permute index is incremented at Block 120. Permutation of the code sequence and/or code context is described more fully below. After permutation of the code sequence has been performed and a permuted code sequence and/or permuted code context has been generated at Block 120, then the flow returns to Block 30 for generation of predicted results of the permuted code sequence. If, however, permutation of the code sequence and/or code context is not to be performed because the permute index is less than the predetermined number of permutes chosen for this particular code sequence, then the flow continues to Block 130.

After comparing the predicted results generated by emulating the initial, unpermuted code sequence against actual results generated by running the initial, unpermuted code sequence on the device, rather than discarding the initial, unpermuted code sequence it is further utilized by permuting either its initial context or the code itself. Instead of utilizing the inefficient process of software emulation to predict new results for the permuted code sequence and/or code context generated by Block 120, the predicted (expected) results of Block 30 are generated by running the permuted code sequence on the device under a first operating point having a first electrical parameter of interest, either F1 or V1, for instance, as illustrated in FIG. 2. Given the deterministic nature of processor execution of code on a device capable of running code, such as a microprocessor, the expected or predicted results obtained by running the device under the first operating point should match the actual results obtained by running the same permuted code sequence on the device under the second operating point. In addition to permuting the initial context in which the code sequence is run, the code sequence itself may be permuted as mentioned above; permuting the code sequence itself rather than permuting the initial context in which the code sequence will run provides the additional benefit of exercising the microprocessor more robustly with the introduction of new test conditions, such as new register data dependencies, result bypassing, pipeline stalls, etc.

At Block 130, the permute index is reset to zero. At Decision Block 140 the inquiry is whether any more code sequences are to be generated at Block 20. This is determined by comparing a sequence index to a predetermined number of sequences to be run by the device. If the sequence index is less than the predetermined number of sequences chosen for testing of the device, then a new code sequence is generated at Block 20 and the entire methodology of flowchart 10, after Block 20, is repeated for the new code sequence. If, however, the sequence index is not less than the predetermined number of sequences, then electrical verification of the device using the invention is complete.

It is herein noted that the permutation of the code sequence at Block 120, while shown in the preferred embodiment of the invention in FIG. 1, is not required to practice the invention. By setting the number of permutations to 0, for instance, one can ensure that permutation of the code sequence generated at Block 20 never occurs and that the flow would automatically continue on to Decision Block 140 for a decision about whether more code sequences are to be generated at Block 20 for subsequent operation-point differentiated testing of the device. Similarly, it is not a requirement of the present invention that multiple code sequences be generated at Block 20, although multiple code sequences are seen to provide advantages for electrical verification of devices. By setting the sequence index to 0 or 1, for instance, one can ensure that Block 20 generates only a single code sequence for testing; of course, permutation(s) may be performed on this single code sequence in the manner described above. One could even run the same code sequence over and over again if reliability of the device is the primary characteristic to be tested.

It is hereby acknowledged that while permutation of the code sequence is not necessary to practice the invention, the fullest benefit of the invention is realized through either code permutation and/or context permutation. Permutation of code or context is much quicker than algorithmic generation of code sequence or context, which in turn is must quicker than software emulation.

Permutation

Multiple verification cases consisting of code sequence and initial context, and suitable for electrical verification testing of a device, are generated from a single verification case by permuting, or changing, the code sequence, by either permuting the initial context of the code sequence or permuting the code sequence itself. The code sequence is an array of computer instructions to be executed by a computer. The initial context of the code sequence refers to the environment in which the code sequence is to be run and is defined by a variety of factors, including, but not limited to, values contained in general register tables, floating point register tables, and cache memory tables, for instance.

Permuting the Initial Context Under which a Code Sequence is Run

The permutation technique of the present invention for permuting the initial context upon which a code sequence operates, referred to as context permutation, quickly to create new data values contained within a data table stored within a storage element of the device, such as new floating point numbers of a floating point register table or new memory values of a cache memory table, for instance, by inverting the value of a contiguous sub-range of bits of an existing data value of the table. The bit width, or width, of the sub-range, as measured by the number of bits, and the bit position, or offset, within the range of bits of the existing data value (defined as an offset within a number, such as an offset within 32/64 bit number) are varied to create mathematically significant operands, such as floating point operands. The ability to create mathematically significant operands, by inverting contiguous sub-ranges of bits, is significant. Contiguous strings of 1's and 0's are mathematically important cases for exciting adder carry chains, rounding corner cases, etc. The stored data value to be permuted may be a 32-bit, a 64-bit number, or an upper half or a lower half of a number, such as the upper 32 bits or lower 32-bits of a 64-bit word, for instance.

Figure 3:
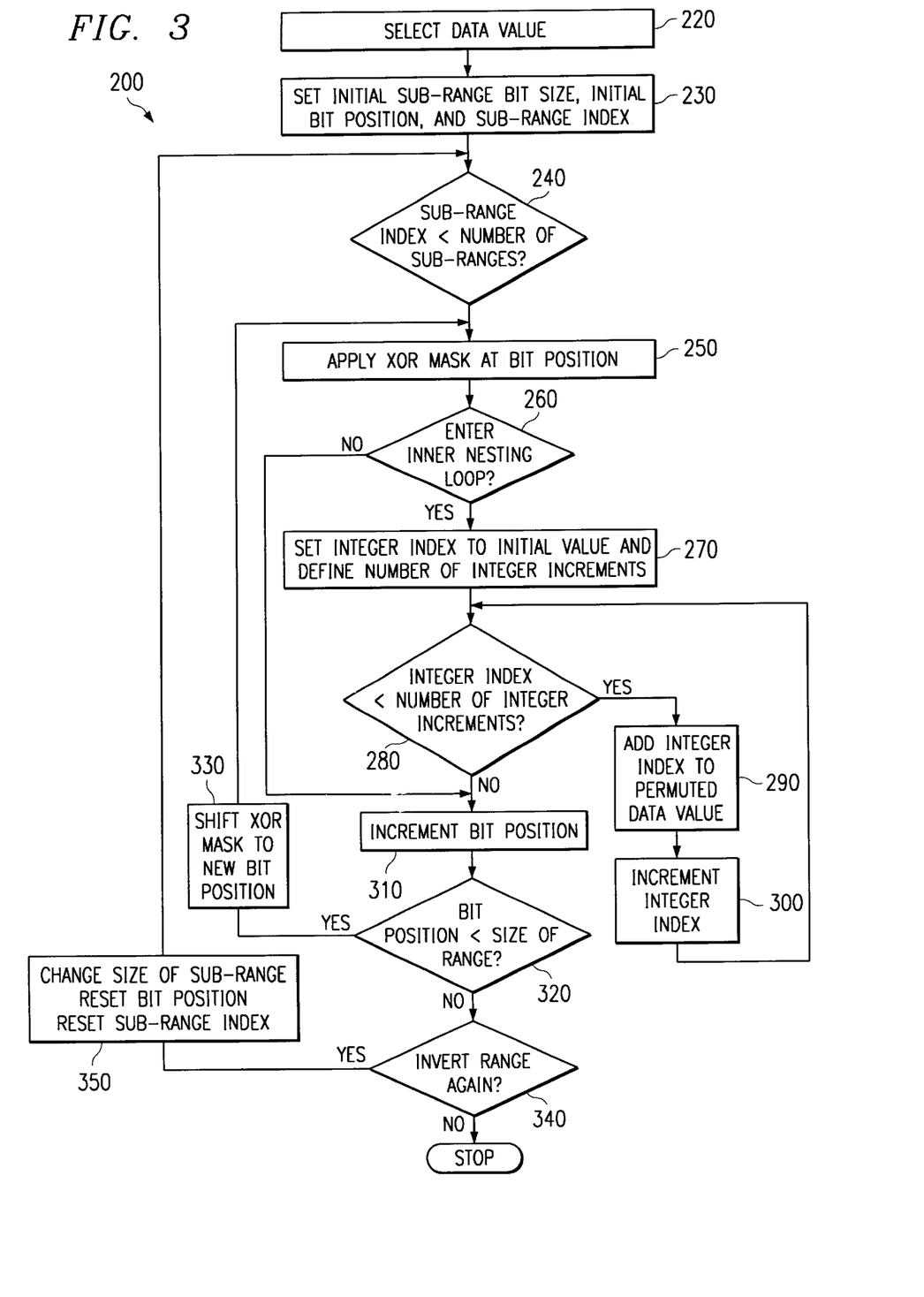
FIG. 3 illustrates the methodology for permuting an initial context under which a device runs a code sequence, in accordance with the present invention.

Referring now to FIG. 3, a flow 200 for permuting an initial context under which a device runs a code sequence is illustrated. At Block 220, a data value to be permuted is selected; the data value at least in part helps define the initial context and thus permuting the data value will allow the initial context under which the code sequence is run to be at least partially permuted. The data value may be contained within a data table of a storage element of the device, such as a floating point register, a general-purpose register, or a cache memory. The data value has a number of bits arranged in a range that define the bit width of the data value. Next, at Block 230, various values must be defined. The range of bits that define the data value are grouped in contiguous sub-ranges, from a least significant to a most significant sub-range, the bit width of which defines the number of sub-ranges. Thus, the sub-range bit width is set to an initial value. If the number of bits of the range of bits is evenly divisible by the initial value of the sub-range bit width, then all sub-ranges have the same, uniform sub-range bit width. If, however, the number of bits of the range are not evenly divisible by the selected initial value of the sub-range bit width, meaning there is a remainder, then all of the sub-ranges are the same, uniform selected bit width except for the most significant sub-range, which has a bit width determined by the remainder. Consider, for instance, a 32-bit number. The range of bits is 32 bits. If a sub-range bit width of 8 bits is selected, then there will be 4 contiguous sub-ranges each being 8 bits in width since the 32 bits of the range are evenly divisible by the 8 bits of the sub-range bit width. If the sub-range bit width were selected to be 6 bits, however, than there would be 6 sub-ranges. The first 5 sub-ranges would have a bit width of 6 bits but the $6^{th}$ sub-range would have a bit width of 2 bits, the remainder when 32 is divided by 6. The $6^{th}$ sub-range is referred to as the most significant sub-range since its 2 bits are the 2 most significant bits (MSBs) of the range.

In addition to setting the bit-width of the sub-ranges at Block 220, the initial bit position within the range of bits is set and a sub-range index is also set to an initial value. The bit position indicates on which bits within the range the exclusive OR mask (XOR) is to operate and thus the bit position is dependent upon the sub-range width selected. Initially, the bit position is set to 1 or the least significant bit (LSB) within the range of bits. The sub-range index keeps track of the number of sub-ranges to which the XOR mask has been applied; the initial value of the sub-range index is normally 1.

Next, at Decision Block 240, the sub-range index is compared to the number of sub-ranges in the range. Again, the number of sub-ranges in the range is determined by dividing the bit width of the range by the bit-width of the sub-range. If the sub-range index is less than the number of sub-ranges, then at Block 250 the XOR mask is applied to the sub-range indicated by the bit position, which means that the XOR mask is first applied to the first, or least significant, sub-range containing the least significant bits (LSBs) of the range. Applying the XOR mask to the selected sub-range inverts the bits contained within that range to permute the original data value.

After the mask has been applied to a sub-range to invert the bits of that sub-range and thus generate a permuted value, further permutation on that permuted value may be optionally performed at the inner (minor) nesting loop represented by Blocks 260–300. At Decision Block 260, the inquiry is whether the inner nesting loop is to be entered to add N incremental values to the permuted data value. If yes, then at Block 270, an integer index is set to an initial value, such as 1, and the predetermined number of increments N is defined. The initial integer index is compared to the predetermined number of increments N at Decision Block 280 and if the integer index is less than N, indicating that the permuted data value is to be incremented, then the permuted data value is incremented by adding the integer index to it at Block 290 and the integer index is incremented at Block 300 as shown. The inner nesting loop of Blocks 260–300 are optional and not necessary to a practice of the invention. The flow of FIG. 1 could continue directly from Decision Block 260 to Block 310 if the inner nesting loop is not to be entered.

After the mask has been applied to the selected sub-range to yield a permuted data value at Block 250, and the optional integer incrementation of the permuted data value has been performed at Blocks 260–300 if desired, then the bit position is incremented at Block 310 so as to indicate or correspond to the next, contiguous sub-range; thus, the bit position is incremented by the bit-width of the sub-ranges. For example, if sub-range width is 7 bits than the bit position would be incremented to correspond to the $8^{th}$ bit within the range. At Block 320, the inquiry is whether the now-incremented bit position is less than the bit width of the range; this inquiry will provide an indication of whether additional sub-ranges are to be permuted. If the incremented bit position is less than the bit width of the range, an indication that there are sub-ranges that have not yet been permuted, then at Block 330 the XOR mask shifts to the incremented bit position of the next, contiguous sub-range and the flow returns to Block 250 to apply the mask to this sub-range. This flow is repeated until, at Decision Block 320, the bit position is no longer less than the width of the range, and all of the sub-ranges and thus the data value selected at Block 220 has been fully inverted. At this point, the flow progresses to Decision Block 340 where the inquiry is whether the range of bits is to inverted again (thereby allowing the initial data value selected at Block 220 to be re-generated. If no, then the flow 200 ends. If yes, then the bit width of the sub-ranges is changed, the bit position within the data range is reset, and the sub-range index is reset at Block 350. Changing the bit width of the sub-ranges, such as increasing the bit width, has the effect of allowing different, mathematically significant operands or data values to be generated by the permutation process, as the bits within the sub-ranges will change with the sub-range width. The flow will return to Decision Block 240 and subsequently to Blocks 250–340 to permute the inverted data value generated the first time through and eventually yield the original data value selected at Block 220.

It is noted that each of the permuted data values that are generated by the flow 200 of FIG. 3 may be optionally stored in the storage element, such as within a data table of a storage element of the device if so desired.

An example of how the methodology of the present invention may be practiced will now be described in conjunction with Tables 1–3 below. In Table 1 a 32-bit number ffffffff is selected; this data value will be permuted by the method disclosed in FIG. 3. A sub-range bit width of 7 is chosen, so that 5 sub-ranges are defined: the first 4 sub-ranges will have a bit width of 7 but the $5^{th}$ and most significant sub-range will have a bit width of 4, the remainder of dividing the 32-bit width of the range by the sub-range bit width of 7. The resultant permuted data values generated by sequentially applying the XOR mask to the contiguous sub-ranges of the range, starting with the least significant sub-range, is shown in Table 1.

TABLE 1

| STEP | 32-BIT NUMBER | RESULTANT NUMBER (PERMUTED DATA VALUE) |
|---|---|---|
| Original Number (data value) | 1111 1111 1111 1111 1111 1111 1111 1111 | ffffffff |
| Step 1 | 1111 1111 1111 1111 1111 1111 1000 0000 | ffffffa0 |
| Step 2 | 1111 1111 1111 1111 1100 0000 0000 0000 | ffffc000 |
| Step 3 | 1111 1111 1110 0000 0000 0000 0000 0000 | ffe00000 |
| Step 4 | 1111 0000 0000 0000 0000 0000 0000 0000 | f0000000 |
| Step 5 | 0000 0000 0000 0000 0000 0000 0000 0000 | 00000000 |

In step 1, it can be seen that the XOR mask is applied to the first seven, contiguous bits in bit locations 0–6 (LSBs) of the first, least significant sub-range in order to invert (flip) each of the bits of this sub-range from 1 to 0. After step 1, the bit position is incremented from bit position 0 to bit position 7 by adding the width of the sub-range (7) to the initial bit position (0). In step 2, the next seven, contiguous bits (in bit locations 7–13) of the next, contiguous sub-range are flipped from all zeroes to all ones by applying the XOR mask at the new bit position of the $7^{th}$ bit. The bit position is again incremented, this time to bit position 14. In step 3, the next seven, contiguous bits in bit locations 14–20 of the third sub-range are inverted to all ones by the XOR mask and the bit position is incremented to bit position 21. Similarly, in step 4, the next seven, contiguous bits in bit locations 21–27 of the fourth sub-range are each flipped or inverted from zero to one by the XOR mask; the bit position is changed to bit position 28. Finally, in step 5 the last four contiguous bits of the fifth and final sub-range of the 32-bit number are inverted by the mask. The bit position would normally be incremented to bit position 35; even though there is no such bit position since the range is 32 bits, the bit position will be subsequently reset to 1 is the range is to again be inverted (please refer to Blocks 340 and 350). A total of five permuted data values have been generated in Table 1. Once the entire number has been inverted in this manner, then the contiguous sub-range increases in width from 7 to 8 bits and the process of inverting the inverted 32-bit number yielded by the steps of Table 1 proceeds anew as shown in Table 2 if the answer to Decision Block 340 has indicated that the data range is to be inverted again. At Decision Block 350 the bit position of 36 would be reset to bit position 0; additionally, the bit width of the sub-range will be changed and the sub-range index will be reset, as explained above.

TABLE 2

| STEP | 32-BIT NUMBER (Pattern) | RESULTANT NUMBER (PERMUTED DATA VALUE) |
|---|---|---|
| Number generated by Table 1 (inverted data value) | 0000 0000 0000 0000 0000 0000 0000 0000 | 00000000 |
| Step 6 | 0000 0000 0000 0000 0000 0000 1111 1111 | 000000ff |
| Step 7 | 0000 0000 0000 0000 1111 1111 1111 1111 | 0000ffff |
| Step 8 | 0000 0000 1111 1111 1111 11111111 1111 | 00ffffff |
| Step 9 | 1111 1111 1111 1111 1111 11111111 1111 | ffffffff |

In Table 2, it can be seen that the sub-range bit width has increased from 7 bits to eight bits; this means that there are 4 sub-ranges, as opposed to the 5 in Table 1, each have the same number of bits-8. The process of applying the XOR mask to each of the sub-ranges, starting with the least significant sub-range, and incrementing the bit position after each permutation, proceeds as explained above. Notice that after inverting bits sequentially across the entire 32-bit number twice, the original data value is returned. Three additional permuted numbers will be generated before re-generating the original number ffffffff. It can be seen that between Table 1 and Table 2 a total of eight permuted data values have been generated by permuting the initial data value of ffff.

For each of the data patterns created in Tables 1 and 2 above, another inner nesting loop that adds another integer increment amount to the resultant or permuted number can be implemented. For example, if an inner nesting integer increment value of 5 is selected, 5 values are created for each of the patterns identified in Tables 1 and 2 by adding 1, 2, 3, 4, and 5 to each of the pattern. Thus, for the first pattern of 1111 1111 1111 1111 1111 1111 1000 0000 identified by Step 1 of FIG. 3, the inner nesting integer increment value of 5 would be implemented as shown below in Table 3.

TABLE 3

| STEP | 32-BIT NUMBER | RESULTANT NUMBER (PERMUTED DATA VALUE) |
|---|---|---|
| Number from Step 1 of Table 1 | 1111 1111 1111 1111 1111 1111 1000 0000 | ffffff80 |
| Increment Step 1 | 1111 1111 1111 1111 1111 1111 1000 0001 | ffffff81 (+1) |
| Increment Step 2 | 1111 1111 1111 1111 1111 1111 1000 0010 | ffffff82 (+2) |
| Increment Step 3 | 1111 1111 1111 1111 1111 1111 1000 0011 | ffffff83 (+3) |
| Increment Step 4 | 1111 1111 1111 1111 1111 1111 1000 0100 | ffffff84 (+4) |
| Increment Step 5 | 1111 1111 1111 1111 1111 1111 1000 0101 | ffffff85 (+5) |

By incrementing the data values for each position of the XOR mask, less redundant values are generated, because the new XOR mask will operate on the result of the previous XOR mask and the integer increment. For the above example, five additional incremented data values would be generated for each of the permuted data values generated in Tables 1 and 2 for a total of 40 permuted data values.

The above algorithm allows the user to select whether just one register should be modified, all registers should be modified, even numbered registers should be modified, or odd number registers should be modified. The algorithm also allows selection of modifying the upper half, lower half, or both halves of a 64-bit word, assuming that the 32-bit number described above is used.

Permuting the initial context upon which the code sequence operates allows those electrical failures of the device that are dependent upon initial context data values to be quickly discovered. Each of the permuted data values generated above represents permutation to the initial context in which the device must run the code sequence and are thus extremely useful for improved electrical verification of the device. A benefit of this technique of permutation is that it largely avoids repetitive data values that might otherwise be created by a technique that randomly sets and clears random bit ranges. Moreover, the present invention provides for permuted context values to be quickly generated and to provide for an improved rate of detection of electrical failures on devices such as microprocessors, DSP devices, and ASICs.

Permuting the Code Sequence

In addition to permuting the initial context of a code sequence, the present invention additionally provides for permuting the code sequence itself to render a permuted code sequence suitable for enhanced electrical verification of a device. Suppose, for instance that an instruction in an initial code sequence to be permuted into a permuted code sequence is:

fadd fr8, fr9, fr10, in which fr8, fr9, and fr10 represent operand a, operand b, and the target, as is understood in the art for a floating point operation in which:

$$\begin{array}{r}\text{operand a (fr8)}\\ +\text{ }\underline{\text{operandb(fr9)}}\\ \text{target (fr10)}\end{array}$$

This instruction in the code sequence could be modified a variety of ways. For example, operand a (fr8) could be changed to a different register, as could operand b (fr9) or the target (fr10). The operation itself could be changed from a fadd operation to a different operation; however, changing the operation of a particular instruction of the code sequence presents the increased difficulty of generating correct instruction format for different instructions. This can be particularly true for some computer architectures having less regular instruction format. In this sense, it may be more straightforward to simply change the operands or targets of an instruction. PA-RISC computer architecture, however, was designed specifically to remedy this difficulty through the use of highly regular instruction formats that are broken into four classes according to the number of operands or targets. A trivial decoding of specific fixed bit positions within the instruction opcode reveals the class of the instruction.

Another example of the difficulty of changing instruction types blindly is changing the fadd fr8, fr9, fr10 code sequence to a memory accessing instructions, such as fload into target register fr10. Since operands fr8, fr9 are random floating point numbers, they cannot be arbitrarily used as indexes into computer memory because they could cause hardware faults such as cache misses, TLB misses, etc. For this reason, the special subset of general registers that are designated as address registers for memory accessing instructions are not generally modified.

Figure 4:
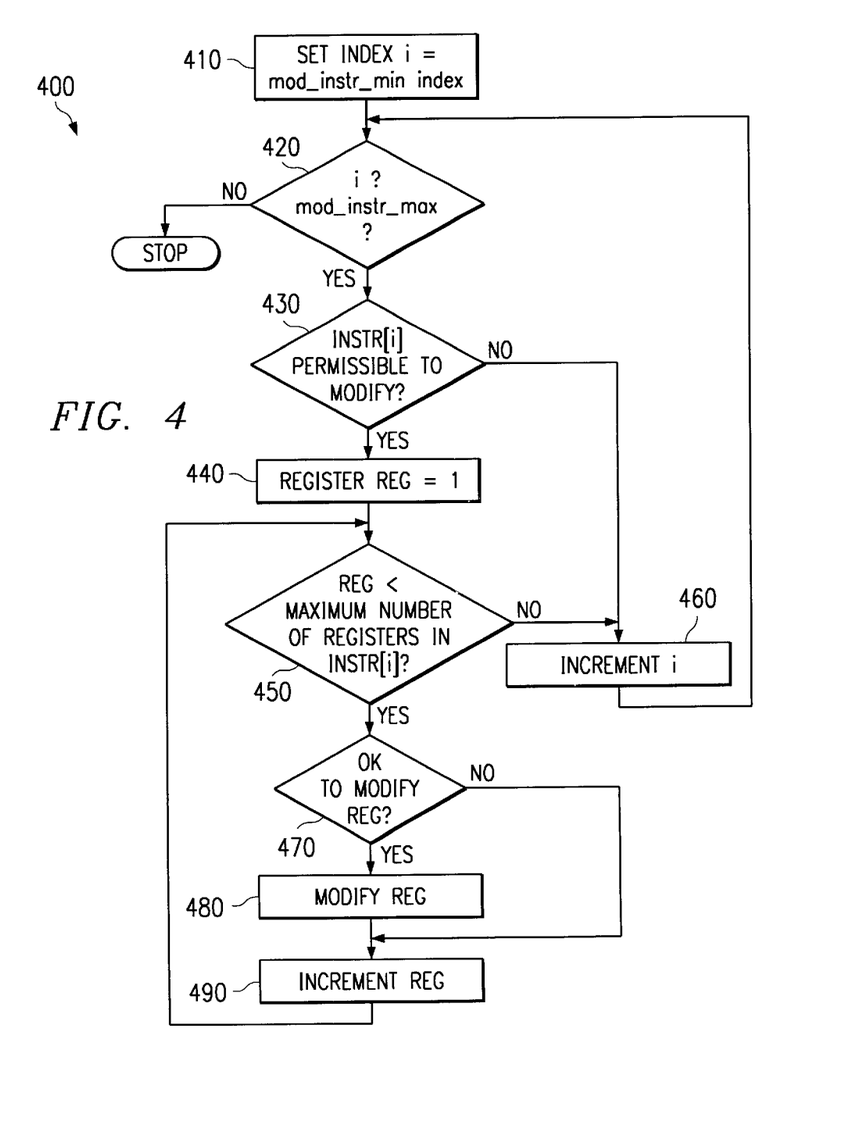
FIG. 4 illustrates the methodology for permuting a code sequence or instruction range to be modified, in accordance with the present invention.

Referring now to FIG. 4, flow 400 illustrates a methodology for permuting the code sequence itself. The code sequence or instruction range to be modified is defined as Instr[1 . . . n], an array of instructions, or instructional opcodes, from 1 to n. At Block 410, an instruction index i is initially set to the mod_instr_min index, the minimum index from 1 . . . n of the instruction range to be modified. Next, at Decision Block 420, the inquiry is whether the index i is less than the mod_instr_max index, the maximum index from 1 . . . n of the instruction range to be modified. If no, then the flow stops. If yes, then at Decision Block 430 the inquiry is whether instruction instr[i] of a type that is permissible to modify, as described above. Instruction instr[i] generally denotes a class of instruction other than floating point operation or floating point load/store instructions. Decision Block 430 checks to make sure that instruction instr[i] is okay to modify. For instance, if a user specified to modify the third operand of a three-operand instruction, such as fmpyadd a,b,c (a+b)*c→c, it would not be permissible or meaningful to modify a fadd operation with one two operands opa & opb. If the instruction instr[i] is not the type of instruction permissible to modify, then the index i is incremented at Block 460. Otherwise, the flow continues to Block 440 to set register field index REG to 1; register field index REG assists in considering all of the registers fields contained within an instruction. At Decision Block 450, REG index is compared to the maximum number of register fields contained within instr[i]. For instance, an instruction load (gr5), fr1 has two register fields in it while another instruction add gr1, gr2, gr3 has three register fields. If REG is not less than the maximum number of register fields contained within instr[i], then the index i is incremented at Block 460. If, however, REG is less than the maximum number of register fields contained within instr[i], then the inquiry at Decision Block 470 is whether it is permissible to modify the register field indicated by register field index REG. In other words, has a user of the device indicated that the particular register field is okay to modify? If no, then the register field index REG is incremented at Block 490 to point to a different register field within the instruction i. If yes, then the register index REG is modified in some desirable manner at Block 470 before register index REG is incremented at Block 490.

Permuting the code sequence itself provides the additional benefits of more robustly testing the device for electrical failures or weaknesses by exercising new interlocks, pipeline stalling, result bypassing, introducing new register data dependencies, etc. of the device. Modifying the code sequence itself gives a more robust suite of verification code sequences than can be achieved by only modifying the initial context of the code sequence.

An additional benefit of the ability to modify specific elements of the initial context of a code sequence or to modify the code sequence itself is that it enhances productive debugging of code sequences that reveal electrical failures of the device. Thus, for instance, if the instruction: fadd fr7, fr8, fr9 fails, then different register values for fr7 and fr8 could be tested to ascertain whether new register values allow the device to pass electrical verification testing. Moreover, examination and interpretation of failing patterns that might emerge may provide insight into the nature of a particular electrical failure.

The present invention eliminates almost all of the software emulation and thus improves electrical verification throughput dramatically, throughput being the amount of time required to compare predicted with actual test results. Using the present invention a 40×(4000%) throughput improvement in the electrical verifications of microprocessors, for instance, has been realized. The present invention also eliminates the time-intensive task of tracking down emulation bugs associated with software emulation.

While the invention has been particularly shown and described with reference to a preferred embodiment, it will be understood by those skilled in the art that various changes in form and detail may be made therein without departing from the spirit and scope of the invention.

What is claimed is:

1. A method for improving electrical verification of a device by employing operating-point differentiated testing, comprising:

a) generating a code sequence;

b) generating predicted results of the device running the code sequence;

c) switching the device from a first operating point having a plurality of parameters to a second operating point having a plurality of parameters;

d) running the code sequence on the device at a second operating point having one or more electrical parameters to generate actual results; and e) comparing the actual results to the predicted results to determine if there is a match between the actual results and the predicted results.

2. The method of claim 1, wherein generating the code sequence is performed by software emulation.

3. The method of claim 1, wherein after running the code sequence on the device at the second operating point to generate the actual results and prior to comparing the actual results to the predicted results, comprising:

switching to the first operating point of the device.

4. The method of claim 1, wherein the code sequence is determined by a plurality of probabilities of a probability file assigned to a plurality of instruction types.

5. The method of claim 1, wherein generating predicted results comprises:

if software emulation is to be used for generating predicted results, performing software emulation of the code sequence to generate the predicted results; and if software emulation is not to be used for generating predicted results, running the code sequence on the device at the first operating point having one or more electrical parameters to generate the predicted results.

6. The method of claim 1, wherein if there is not a match between the actual results and the predicted results, then generating an indication that the actual results do not match the predicted results.

7. The method of claim 5, wherein the indication is an error message.

8. The method of claim 6, wherein the indication is an error message that is printed.

9. The method of claim 6, wherein the indication is an error message that is displayed.

10. The method of claim 1, wherein if the actual results do not match the predicted results, performing a software emulation of the code sequence to verify the predicted results.

11. The method of claim 10, further comprising generating an indication of the one or more differences between the actual results and the predicted results.

12. The method of claim 11, wherein the indication is an error message.

13. The method of claim 12, wherein the error message is printed.

14. The method of claim 12, wherein the error message is displayed.

15. The method of claim 1, wherein switching the device from a first operating point to a second operating point is accomplished by changing a parameter of the plurality of parameters of the first operating point to define the second operating point.

16. The method of claim 1, further comprising:

f) comparing a permute index to a number of permutes to be performed on the code sequence; and g) if the permute index is less than the number of permutes to be performed, permuting the code sequence to generate a permuted code sequence, incrementing the permute index, and performing b) through f) on the permuted code sequence.

17. The method of claim 16, further comprising:

h) if the permute index is not less than the number of permutes to be performed, resetting the permute index;

i) comparing a sequence index to a number of sequences to be generated; and j) if the sequence index is less than the number of sequences, generating a new code sequence and performing b) through i) for the new code sequence.

18. The method of claim 16, wherein the permute index is reset to zero.

19. The method of claim 16, wherein permuting the code sequence to generate a permuted code sequence, comprises:

A) selecting a data value having a number of bits of a range, stored in a storage element of the device and defined by a plurality of contiguous sub-ranges with each sub-range having a uniform bit width defined by a number of bits except for a most significant sub-range if the number of bits of the range divided by the number of bits of the uniform bit width yields a remainder in which the most significant sub-range has a bit width defined by the remainder, that in part defines the initial context;

B) sequentially permuting each contiguous sub-range of the plurality of sub-ranges of the data value to generate a plurality of permuted data values and thus a plurality of permuted initial contexts; and C) running the code sequence on the device under each permuted initial context of the plurality of permuted initial contexts.

20. The method of claim 19, wherein permuting the data value to generate the permuted data value comprises:

B.1) inverting a least significant contiguous sub-range of a plurality of contiguous sub-ranges of the data value to generate an initial permuted data value;

B.2) incrementing a bit position within the range of bits of the data value by an amount equal to the bit width of the contiguous sub-range;

B.3) inverting a contiguous sub-range indicated by the incremented bit position to generate a permuted data value; and B.4) repeating B.2) and B.3) for all remaining contiguous sub-ranges of the plurality of contiguous sub-ranges to generate a plurality of permuted data values, one for each contiguous sub-range, until the range of bits has been fully inverted to generate an inverted data value.

21. The method of claim 20, further comprising:

after inverting the least significant contiguous sub-range to generate the initial permuted data value, incrementing the initial permuted data value N times to generate N incremental initial permuted data values.

22. The method of claim 16, wherein permuting the code sequence includes permuting an initial context under which the device operates, comprising:

A) selecting a data value, comprised of a range of bits that defines a bit width of the data value and stored in a storage element of the device, to be permuted that in part defines the initial context;

B) setting a sub-range bit width to an initial value, wherein the sub-range bit width defines a number of contiguous sub-ranges of the range of bits from a least significant sub-range to a most-significant sub-range, with each contiguous sub-range of the number of contiguous sub-ranges having a bit width defined by the sub-range width if the bit width of the range of bits is evenly divisible by the initial sub-range width and if the bit width of the range of bits is not evenly divisible by the initial sub-range width the bit width of the most-significant sub-range is determined by a remainder determined by dividing the range of bits bit width by the sub-range width;

C) setting a bit position of the range of bits to an initial value;

D) setting a sub-range index to an initial value;

E) if the sub-range index is less than the number of sub-ranges, comprising:

1. applying an XOR mask to a sub-range of the number of sub-ranges indicated by the bit position to invert the bits of the sub-range and generate a permuted data value and thus a permuted initial context;

2. running the code sequence on the device under the permuted initial context;

3. incrementing the bit position to correspond to a more significant, contiguous sub-range of the plurality of contiguous sub-ranges; and 4. if the bit position is less than the bit width of the range, shifting the XOR mask to the bit position and returning to E1);

F) if the sub-range index is not less than the number of sub-ranges or if the bit position is not less than the bit width of the range, an indication that the range of bits has been permuted, determining whether to again permute the range of bits; and G) if the range of bits is to again be permuted, changing the sub-range bit width and recalculating the number of sub-ranges in view of the changed sub-range bit width, resetting the bit position to the initial value, and resetting the sub-range index to the initial value and returning to E).

23. The method of claim 22, wherein after generating the permuted data value in E.1), further comprising:

incrementing the permuted data value N times to generate N incremental permuted data values.

24. The method of claim 23, wherein incrementing the permuted data value N times to generate N incremental permuted data values comprises:

E.1.a) setting an integer index to an initial value and selecting a predetermined number of increments N;

E.1.b) comparing the integer index to the predetermined number of increments N; and E.1.c) if the integer index is less than the predetermined number of increments N, incrementing the permuted data value, incrementing the integer index, and repeating E.1.a)–E.1.c).

25. The method of claim 16, wherein permuting the code sequence includes permuting the code sequence itself, comprising:

A. setting an instruction index to a predetermined minimum instruction index value;

B. determining whether the instruction index is less than a predetermined maximum instruction index value;

C. if the instruction index is less than the predetermined maximum instruction index value, determining whether an instruction of the code sequence indicated by the instruction index is permissible to modify, wherein:

C.1) if an instruction of the code sequence indicated by the instruction index is permissible to modify, comprising:

C.1.a) setting a register index of the instruction to a minimum value, wherein the register index indicates the number of register fields of the instruction;

C.1.b) determining whether the register index is less than a predetermined maximum number of register fields in the instruction, wherein:

C.1.b.i) if the register index is less than a predetermined maximum number of register fields in the instruction, comprising:

C.1.b.i.A.) if the register index indicates a register field of the instruction that is permissible to modify, then modifying the register field of the instruction, incrementing the register index, and returning to C.1.b); and C.1.b.i.B) if the register index indicates the register field of the instruction is not permissible to modify, then incrementing the register index, and returning to C.1.b);

C.1.b.ii) if the register index is not less than the predetermined maximum number of register fields in the instruction, comprising:

C.1.b.ii.A) incrementing the instruction index; and

C.1.b.ii.B) returning to B);

C.2) if the instruction of the code sequence indicated by the instruction index is not permissible to modify, comprising:

C.2.a) incrementing the instruction index; and

C.2.b) returning to B).

26. The method of claim 16, wherein permuting the code sequence comprises:

A) setting an instruction index to a predetermined minimum instruction index value;

B) determining whether the instruction index is less than a predetermined maximum instruction index value;

C) if the instruction index is less than the predetermined maximum instruction index value, determining whether an instruction of the code sequence indicated by the instruction index is permissible to modify, wherein:

C.1) if an instruction of the code sequence indicated by the instruction index is permissible to modify, comprising:

C.1.a) setting a register index of the instruction to a minimum value, wherein the register index indicates the number of register fields of the instruction;

C.1.b) determining whether the register index is less than a predetermined maximum number of register fields in the instruction, wherein:

C.1.b.i) if the register index is less than a predetermined maximum number of register fields in the instruction, comprising:

C.1.b.i.A) if the register index indicates a register field of the instruction that is permissible to modify, then modifying the register field of the instruction, incrementing the register index, and returning to C.1.b); and C.1.b.i.B) if the register index indicates the register field of the instruction is not permissible to modify, then incrementing the register index, and returning to C.1.b).

C.1.b.ii) if the register index is not less than the predetermined maximum number of register fields in the instruction, comprising:

C.1.b.ii.A) incrementing the instruction index; and

C.1.b.ii.B) returning to B). p2 C.2) if the instruction of the code sequence indicated by the instruction index is not permissible to modify, comprising:

C.2.a) incrementing the instruction index; and

C.2.b) returning to B).

27. A computer-readable medium having a computer program for improving electrical verification of a device by employing operating-point differentiated testing, comprising:

a) instructions for generating a code sequence;

b) instructions for generating predicted results of the device running the code sequence;

c) instructions for switching the device from a first operating point having a plurality of parameters to a second operating point having a plurality of parameters;

d) instructions for running the code sequence on the device at a second operating point having one or more electrical parameters to generate actual results; and e) instructions for comparing the actual results to the predicted results to determine if there is a match between the actual results and the predicted results.

28. The medium of claim 27, wherein after running the code sequence on the device at the second operating point to generate the actual results and prior to comparing the actual results to the predicted results, comprising:

instructions for switching to the first operating point of the device.

29. The medium of claim 27, further comprising:

f) instructions for comparing a permute index to a number of permutes to be performed on the code sequence; and g) if the permute index is less than the number of permutes to be performed, instructions for permuting the code sequence to generate a permuted code sequence, incrementing the permute index, and performing b) through f) on the permuted code sequence.

30. The medium of claim 29, further comprising:

h) if the permute index is not less than the number of permutes to be performed, instructions for resetting the permute index.

31. The medium of claim 29, further comprising:

h) instructions for comparing a sequence index to a number of sequences to be generated; and i) if the sequence index is less than the number of sequences, instructions for generating a new code sequence and performing b) through g) for the new code sequence.

32. The medium of claim 27, wherein permuting the code sequence to generate a permuted code sequence, comprises:

A) selecting a data value having a number of bits of a range, stored in a storage element of the device and defined by a plurality of contiguous sub-ranges with each sub-range having a uniform bit width defined by a number of bits except for a most significant sub-range if the number of bits of the range divided by the number of bits of the uniform bit width yields a remainder in which the most significant sub-range has a bit width defined by the remainder, that in part defines the initial context;

B) sequentially permuting each contiguous sub-range of the plurality of sub-ranges of the data value to generate a plurality of permuted data values and thus a plurality of permuted initial contexts; and C) running the code sequence on the device under each permuted initial context of the plurality of permuted initial contexts.

33. The medium of claim 32, wherein permuting the data value to generate the permuted data value comprises:

B.1) inverting a least significant contiguous sub-range of a plurality of contiguous sub-ranges of the data value to generate an initial permuted data value;

B.2) incrementing a bit position within the range of bits of the data value by an amount equal to the bit width of the contiguous sub-range;

B.3) inverting a contiguous sub-range indicated by the incremented bit position to generate a permuted data value; and B.4) repeating B.2) and B.3) for all remaining contiguous sub-ranges of the plurality of contiguous sub-ranges to generate a plurality of permuted data values, one for each contiguous sub-range, until the range of bits has been fully inverted to generate an inverted data value.

34. The medium of claim 33, further comprising:

after inverting the least significant contiguous sub-range to generate the initial permuted data value, incrementing the initial permuted data value N times to generate N incremental initial permuted data values.

35. The medium of claim 27, wherein permuting the code sequence includes permuting an initial context under which the device operates, comprising:

A) selecting a data value, comprised of a range of bits that defines a bit width of the data value and stored in a storage element of the device, to be permuted that in part defines the initial context;

B) setting a sub-range bit width to an initial value, wherein the sub-range bit width defines a number of contiguous sub-ranges of the range of bits from a least significant sub-range to a most-significant sub-range, with each contiguous sub-range of the number of contiguous sub-ranges having a bit width defined by the sub-range width if the bit width of the range of bits is evenly divisible by the initial sub-range width and if the bit width of the range of bits is not evenly divisible by the initial sub-range width the bit width of the most-significant sub-range is determined by a remainder determined by dividing the range of bits bit width by the sub-range width;

C) setting a bit position of the range of bits to an initial value;

D) setting a sub-range index to an initial value;

E) if the sub-range index is less than the number of sub-ranges, comprising:

1. applying an XOR mask to a sub-range of the number of sub-ranges indicated by the bit position to invert the bits of the sub-range and generate a permuted data value and thus a permuted initial context;

2. running the code sequence on the device under the permuted initial context;

3. incrementing the bit position to correspond to a more significant, contiguous sub-range of the plurality of contiguous sub-ranges; and 4. if the bit position is less than the bit width of the range, shifting the XOR mask to the bit position and returning to E1);

F) if the sub-range index is not less than the number of sub-ranges or if the bit position is not less than the bit width of the range, an indication that the range of bits has been permuted, determining whether to again permute the range of bits; and G) if the range of bits is to again be permuted, changing the sub-range bit width and recalculating the number of sub-ranges in view of the changed sub-range bit width, resetting the bit position to the initial value, and resetting the sub-range index to the initial value and returning to E).

36. The medium of claim 35, wherein after generating the permuted data value in E.1), further comprising:

incrementing the permuted data value N times to generate N incremental permuted data values.

37. The medium of claim 36, wherein incrementing the permuted data value N times to generate N incremental permuted data values comprises:

E.1.a) setting an integer index to an initial value and selecting a predetermined number of increments N;

E.1.b) comparing the integer index to the predetermined number of increments N; and E.1.c) if the integer index is less than the predetermined number of increments N, incrementing the permuted data value, incrementing the integer index, and repeating E.1.a)–E.1.c).

38. The medium of claim 27, wherein permuting the code sequence includes permuting the code sequence itself, comprising:
- A. setting an instruction index to a predetermined minimum instruction index value;
- B. determining whether the instruction index is less than a predetermined maximum instruction index value;
- C. if the instruction index is less than the predetermined maximum instruction index value, determining whether an instruction of the code sequence indicated by the instruction index is permissible to modify, wherein:
  - C.1) if an instruction of the code sequence indicated by the instruction index is permissible to modify, comprising:
    - C.1.a) setting a register index of the instruction to a minimum value, wherein the register index indicates the number of register fields of the instruction;
    - C.1.b) determining whether the register index is less than a predetermined maximum number of register fields in the instruction, wherein:
      - C.1.b.i) if the register index is less than a predetermined maximum number of register fields in the instruction, comprising:
        - C.1.b.i.A.) if the register index indicates a register field of the instruction that is permissible to modify, then modifying the register field of the instruction, incrementing the register index, and returning to C.1.b); and
        - C.1.b.i.B) if the register index indicates the register field of the instruction is not permissible to modify, then incrementing the register index, and returning to C.1.b);
      - C.1.b.ii) if the register index is not less than the predetermined maximum number of register fields in the instruction, comprising:
        - C.1.b.ii.A) incrementing the instruction index; and
        - C.1.b.ii.B) returning to B);
  - C.2) if the instruction of the code sequence indicated by the instruction index is not permissible to modify, comprising:
    - C.2.a) incrementing the instruction index; and
    - C.2.b) returning to B).

39. The medium of claim 27, wherein permuting the code sequence comprises:
- H) setting an instruction index to a predetermined minimum instruction index value;
- I) determining whether the instruction index is less than a predetermined maximum instruction index value;
- J) if the instruction index is less than the predetermined maximum instruction index value, determining whether an instruction of the code sequence indicated by the instruction index is permissible to modify, wherein:
  - C.1) if an instruction of the code sequence indicated by the instruction index is permissible to modify, comprising:
    - C.1.a) setting a register index of the instruction to a minimum value, wherein the register index indicates the number of register fields of the instruction;
    - C.1.b) determining whether the register index is less than a predetermined maximum number of register fields in the instruction, wherein:
      - C.1.b.i) if the register index is less than a predetermined maximum number of register fields in the instruction, comprising:
        - C.1.b.i.A) if the register index indicates a register field of the instruction that is permissible to modify, then modifying the register field of the instruction, incrementing the register index, and returning to C.1.b); and
        - C.1.b.i.B) if the register index indicates the register field of the instruction is not permissible to modify, then incrementing the register index, and returning to C.1.b).
      - C.1.b.ii) if the register index is not less than the predetermined maximum number of register fields in the instruction, comprising:
        - C.1.b.ii.A) incrementing the instruction index; and
        - C.1.b.ii.B) returning to B).
  - C.2) if the instruction of the code sequence indicated by the instruction index is not permissible to modify, comprising:
    - C.2.a) incrementing the instruction index; and
    - C.2.b) returning to B).

40. The medium of claim 27, wherein generating predicted results comprises:
  if software emulation is to be used for generating predicted results, instructions for performing software emulation of the code sequence to generate the predicted results; and
  if software emulation is not to be used for generating predicted results, instructions for running the code sequence on the device at the first operating point having one or more electrical parameters to generate the predicted results.

41. The medium of claim 27, wherein if there is not a match between the actual results and the predicted results, then instructions for generating an indication that the actual results do not match the predicted results.

42. The medium of claim 27, wherein switching the device from a first operating point to a second operating point is accomplished by instructions for changing a parameter of the plurality of parameters of the first operating point to define the second operating point.

* * * * *

UNITED STATES PATENT AND TRADEMARK OFFICE
CERTIFICATE OF CORRECTION

PATENT NO. : 6,564,162 B1 Page 1 of 1
DATED : May 13, 2003
INVENTOR(S) : Keith H. Erskine et al.

It is certified that error appears in the above-identified patent and that said Letters Patent is hereby corrected as shown below:

<u>Column 18,</u>
Line 51, after "B)." delete "p2" and begin a new paragraph

Signed and Sealed this

First Day of February, 2005

JON W. DUDAS
*Director of the United States Patent and Trademark Office*